US012620905B2

(12) United States Patent
Harrison

(10) Patent No.: US 12,620,905 B2
(45) Date of Patent: May 5, 2026

(54) METHODS AND APPARATUS FOR CONTROLLING SWITCHING IN POWER CONVERTERS

(71) Applicant: Enphase Energy, Inc., Petaluma, CA (US)

(72) Inventor: Michael J. Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 196 days.

(21) Appl. No.: 18/609,442

(22) Filed: Mar. 19, 2024

(65) Prior Publication Data

US 2024/0348150 A1 Oct. 17, 2024

Related U.S. Application Data

(60) Provisional application No. 63/459,048, filed on Apr. 13, 2023.

(51) Int. Cl.
| | |
|---|---|
| *H02M 3/335* | (2006.01) |
| *H02M 1/088* | (2006.01) |
| *H02M 7/5387* | (2007.01) |
| *H03K 17/18* | (2006.01) |
| *H03K 17/284* | (2006.01) |

(52) U.S. Cl.
CPC ....... *H02M 3/33592* (2013.01); *H02M 1/088* (2013.01); *H02M 7/5387* (2013.01); *H03K 17/18* (2013.01); *H03K 17/284* (2013.01)

(58) Field of Classification Search
CPC ............ H02M 1/088; H02M 3/33592; H02M 7/5387; H03K 17/18; H03K 17/284
See application file for complete search history.

(56) References Cited

U.S. PATENT DOCUMENTS

| | | | | |
|---|---|---|---|---|
| 9,083,343 B1 * | 7/2015 | Li | ........................ | H03K 17/687 |
| 10,193,462 B1 * | 1/2019 | Leong | ................. | H02M 7/4807 |
| 11,838,017 B2 * | 12/2023 | Harrison | .............. | H10D 30/475 |
| 2008/0278985 A1 | 11/2008 | Ribarich | | |
| 2014/0027785 A1 * | 1/2014 | Rose | ................ | H03K 17/08122 |
| | | | | 257/77 |
| 2014/0146428 A1 * | 5/2014 | Pansier | ................ | H02H 1/0007 |
| | | | | 361/86 |
| 2016/0065203 A1 * | 3/2016 | Zojer | ................. | H03K 17/6871 |
| | | | | 327/109 |

(Continued)

OTHER PUBLICATIONS

PCT International Search Report and Written Opinion for application No. PCT/US2024/020837 dated Jul. 11, 2024, 9 pgs.

(Continued)

*Primary Examiner* — Yusef A Ahmed

(74) *Attorney, Agent, or Firm* — MOSER TABOADA

(57) ABSTRACT

A bridge configured for use with a power converter is provided herein. For example, a switch can include a Gallium-Nitride (GaN) High Electron Mobility Transistor and a Gate driver coupled to the Gallium-Nitride (GaN) High Electron Mobility Transistor and can be configured to provide a turn on signal to the Gallium-Nitride (GaN) High Electron Mobility Transistor at a first time so that the Gallium-Nitride (GaN) High Electron Mobility Transistor turns on at a second time that is different from the first time.

15 Claims, 4 Drawing Sheets

(56) References Cited

U.S. PATENT DOCUMENTS

| | | | | |
|---|---|---|---|---|
| 2016/0308444 A1* | 10/2016 | Hasegawa | ............... | H02M 3/01 |
| 2017/0019095 A1* | 1/2017 | Leong | .................. | H03K 17/167 |
| 2017/0170731 A1* | 6/2017 | Marini | ............ | G01R 19/16504 |
| 2017/0359060 A1* | 12/2017 | Godycki | ................ | H03K 17/74 |
| 2017/0366180 A1* | 12/2017 | Baburske | ............ | H10D 30/669 |
| 2018/0026628 A1* | 1/2018 | Lu | ........................ | H03K 17/163 |
| | | | | 327/108 |
| 2019/0386652 A1* | 12/2019 | Korner | ................ | H03K 17/122 |
| 2020/0328737 A1* | 10/2020 | Rivas-Davila | ........ | H02M 7/003 |
| 2020/0366288 A1* | 11/2020 | Prakash | .................. | H02J 9/062 |
| 2021/0313872 A1* | 10/2021 | Brown | .............. | H02M 3/33523 |
| 2022/0190825 A1* | 6/2022 | Lu | ........................ | H03K 17/163 |
| 2022/0209650 A1* | 6/2022 | Qiu | ......................... | H02M 1/38 |
| 2022/0416678 A1* | 12/2022 | Harrison | ............. | H02M 7/5387 |
| 2024/0178831 A1* | 5/2024 | Qu | .......................... | H02M 1/08 |
| 2024/0283351 A1* | 8/2024 | Mayell | .................... | H02M 3/01 |
| 2024/0313758 A1* | 9/2024 | Chen | .................... | H03K 17/081 |
| 2024/0322814 A1* | 9/2024 | Pulvirenti | ............ | H03K 17/166 |
| 2024/0339923 A1* | 10/2024 | Harrison | ............. | H02M 5/2932 |
| 2025/0260323 A1* | 8/2025 | Qu | ........................ | H02M 1/088 |

OTHER PUBLICATIONS

GaN Systems Inc., "Design with GaN Enhancement Hemt", Feb. 28, 2018, 45 pages.†
Dipankar De and Venkataramanan Ramanarayanan, A DC-to-Three-PHase-AC High-Frequency Link Converter With Compensation for Nonlinear Distortion, IEEE Transactions On Industrial Electronics, vol. 57, No. 11, Nov. 2010, p. 3669-3677.†

* cited by examiner
† cited by third party

Hard-Switched Commutation

Soft-Switched Commutation

METHODS AND APPARATUS FOR CONTROLLING SWITCHING IN POWER CONVERTERS

CROSS-REFERENCE TO RELATED APPLICATION

The present application claims the benefit of and priority to U.S. Provisional Application Ser. No. 63/459,048, filed on Apr. 13, 2023, the entire contents of which is incorporated herein by reference.

BACKGROUND

Field of the Disclosure

Embodiments of the present disclosure relate generally to power conversion systems and, in particular, to methods and apparatus for controlling GaN HEMT devices using GaN HEMT Gate drive logic.

Description of the Related Art

Conventional power converters suitable for use with power conversion systems are known. The power converters can comprise one or more bridges that comprise one or more switches that are driven by a gate driver connected to one or more GaN HEMT (High Electron Mobility Transistor) devices that are connected to the one or more switches. The GaN HEMT devices are gaining popularity to replace conventional Si Super-Junction (SJ) MOSFET devices.

For example, the GaN HEMT devices enable switched mode power converters to operate at switching frequencies that are much higher (e.g., 10×) than what is possible with conventional Si MOSFET devices, i.e., a typical switching frequency for Si MOSFET can be about 100 kHz and a GaN HEMT power transistors switching frequency can be about 1 MHz. The 10× increase in switching frequency can result in switching transition times reducing by an equivalent amount, i.e., a typical commutation time for a Si MOSFET device can be about 500 ns and an equivalent commutation time for the GaN HEMT device can be reduced to about 50 ns.

Accordingly, the adoption of GaN HEMT devices requires a 10× increase in Gate drive timing accuracy. Retaining the Gate drive timing accuracy that was used with Si MOSFET devices, however, negates much of the performance advantage that is expected when changing from Si MOSFET devices to GaN HEMT devices. There are very few technology solutions available due to GaN technology being so new to the market, and the few solutions available tend to be expensive and somewhat lacking in performance.

Thus, there is a need for improved methods and apparatus for controlling GaN HEMT devices using GaN HEMT Gate drive logic that achieves low-cost accurate timing.

SUMMARY

In accordance with at least some embodiments, a bridge configured for use with a power converter comprises a switch comprising a Gallium-Nitride (GaN) High Electron Mobility Transistor and a Gate driver coupled to a gate of the Gallium-Nitride (GaN) High Electron Mobility Transistor and configured to provide a turn on signal to one of the Gallium-Nitride (GaN) High Electron Mobility Transistor at a first time so that the Gallium-Nitride (GaN) High Electron Mobility Transistor turns on at a second time that is different from the first time.

In accordance with at least some embodiments, a power conversion system comprises a converter, a DC component coupled to a DC side of the converter, a plurality of switches coupled to a primary winding of a transformer, and a bridge coupled to a secondary winding of the transformer and comprising a switch comprising a Gallium-Nitride (GaN) High Electron Mobility transistor and a Gate driver coupled to a gate of the Gallium-Nitride (GaN) High Electron Mobility Transistor and configured to provide a turn on signal to the Gallium-Nitride (GaN) High Electron Mobility Transistor at a first time so that the Gallium-Nitride (GaN) High Electron Mobility Transistor turns on at a second time that is different from the first time.

In accordance with at least some embodiments, a method of controlling a bridge configured for use with a power converter comprises determining when a predetermined voltage (Vds) and a rate of change of a blocking voltage (dV/dt) is occurring at a Gallium-Nitride (GaN) High Electron Mobility Transistor and providing a turn on signal at a first time to the Gallium-Nitride (GaN) High Electron Mobility Transistor so that the Gallium-Nitride (GaN) High Electron Mobility Transistor turns on at a second time that is different from the first time.

Various advantages, aspects, and novel features of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure are directed to improved methods and apparatus for controlling GaN HEMT devices using GaN HEMT Gate drive logic that achieves low-cost accurate timing. For example, a bridge configured for use with a power converter can comprise a switch comprising a pair of Gallium-Nitride (GaN) High Electron Mobility Transistors connected in series and a Gate driver coupled to a gate of each of the pair of Gallium-Nitride (GaN) High Electron Mobility Transistors and configured to provide a turn on signal to one of the pair of Gallium-Nitride (GaN) High Electron Mobility Transistors at a first time so that the one of the pair of Gallium-Nitride (GaN) High Electron Mobility Transistors turns on at a second time that is different from the first time. Methods and apparatus described herein provide high performance, low-cost timing accuracy for soft-switched converters.

The foregoing description of embodiments of the disclosure comprises a number of elements, devices, circuits and/or assemblies that perform various functions as described. These elements, devices, circuits, and/or assemblies are exemplary implementations of means for performing their respectively described functions.

Figure 1:
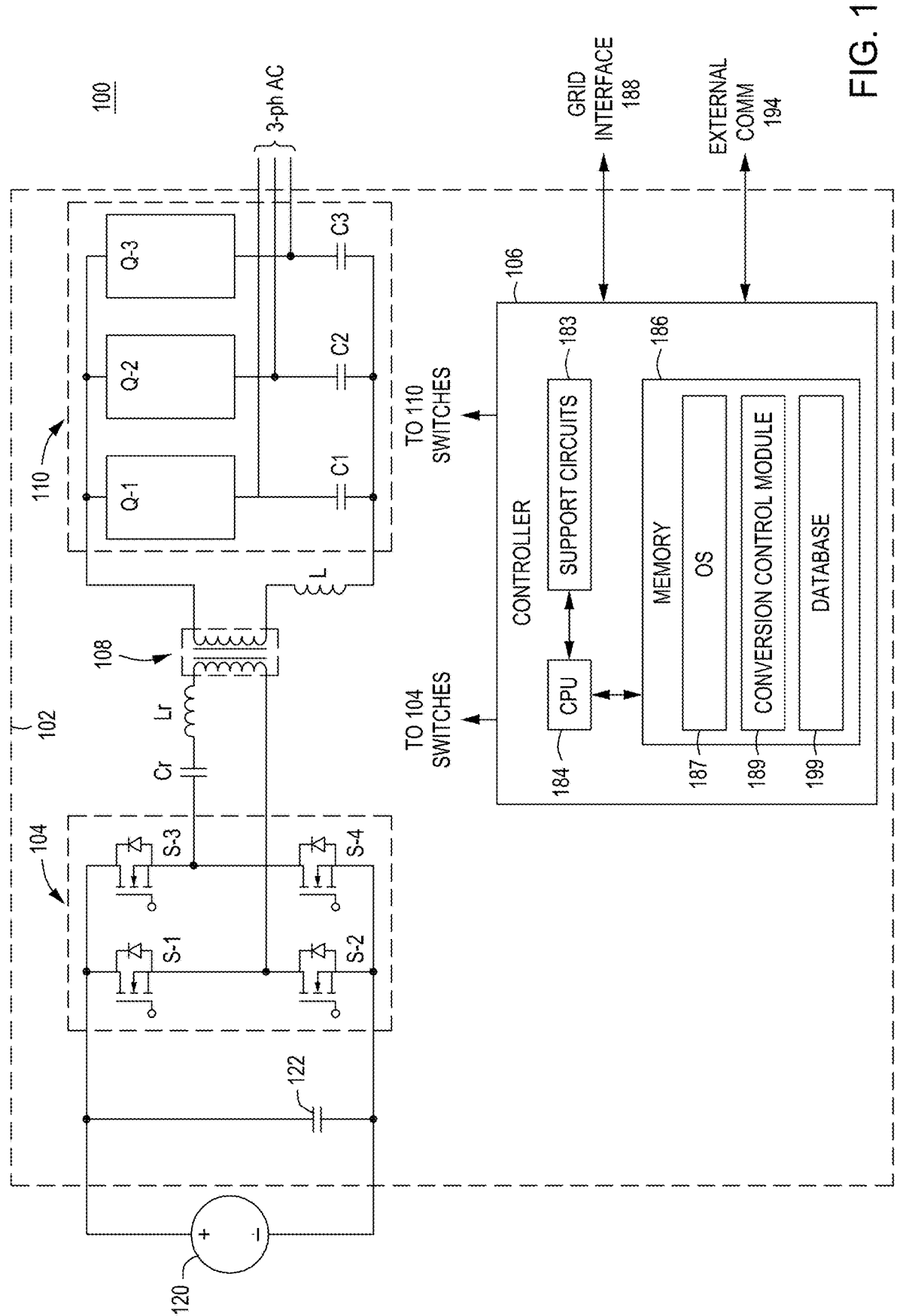
FIG. 1 is a schematic diagram of a power conversion system comprising a switched mode power converter, in accordance with embodiments of the present disclosure.

FIG. 1 is a schematic diagram of a power conversion system 100 comprising a converter 102 (e.g., a switched mode power converter), in accordance with embodiments of the present disclosure. This diagram only portrays one variation of the myriad of possible system configurations. The present disclosure can function in a variety of power generation environments and systems.

The power conversion system 100 comprises a DC component 120, such as a PV module or a battery, coupled to a DC side of the converter 102 (referred to herein as "converter 102"). In other embodiments the DC component 120 may be any suitable type of DC components, such as another type of renewable energy source (e.g., wind farms, hydroelectric systems, and the like), other types of energy storage components, and the like.

The converter 102 comprises a capacitor 122 coupled across the DC component 120 as well as across an H-bridge 104 formed from switches S-1, S-2, S-3 and S-4. The switches S-1 and S-2 are coupled in series to form a left leg of the H-bridge 104, and the switches S-3 and S-4 are coupled in series to form a right leg of the H-bridge 104.

The output of the H-bridge 104 is coupled across a series combination of a capacitor Cr and inductor L, which form a resonant tank, and the primary winding of a transformer 108. In other embodiments, the resonant tank may be formed by a different configuration of the capacitor Cr and the inductor Lr (e.g., the capacitor Cr and the inductor L may be coupled in parallel); in some embodiments, Lr may represent a leakage inductance from the transformer 108 rather than a physical inductor.

A series combination of the secondary winding of the transformer 108 and an inductor L is coupled across a bridge which produces a three-phase AC output, although in other embodiments the bridge may produce one or two phases of AC at its output. The bridge can be a half-bridge, full-bridge, Hex-bridge, etc. formed using switches that are arranged to enable current flow to be alternated. For example, the switches can comprise one or more of semiconductor (or vacuum tube) devices, e.g., Field Effect Transistor (FET), Junction FET (JFET), Metal Oxide Semiconductor FET (MOSFET), High Electron Mobility Transistor (HEMT), etc. The switches can be used for AC-DC conversion and/or DC-AC conversion (e.g., switches that are controllable). The bridge can be a Bi-directional bridge (sometimes referred to as a cycloconverter bridge or cycloconverter for short) that uses two Uni-Directional switches connected in series (back-to-back, which can be referred to as Bi-directional switches)—which can conduct current in either direction (when turned on), can block a voltage of either polarity (when turned off), and can also block a voltage in both polarities (e.g., block polar voltage). For illustrative purposes, the secondary winding of the transformer 108 and the inductor L are assumed coupled across a cycloconverter 110. The cycloconverter 110 comprises three 4Q bi-directional switches Q-1, Q-2, and Q-3 (which may be collectively referred to as switches Q) respectively in a first leg, a second leg, and a third leg coupled in parallel to one another. In accordance with embodiments of the present disclosure, each of the switches Q-1, Q-2, and Q-3 is a native four quadrant bi-directional switch comprising one or more of the aforementioned semiconductor (or vacuum tube) devices. Alternatively or additionally, the cycloconverter 110 can comprise three monolithically formed switches (e.g., a Monolithic Bi-Directional Switch (MBDS))—Gallium-Nitride (GaN) based on a HEMT structure, as described in greater detail below. That is, the MBDS refers to the fact that this Bi-Directional Switch (BDS) can be built in a single semiconductor die. In at least some embodiments, each of the switches Q-1, Q-2, and Q-3 comprises a pair of Gallium-Nitride (GaN) High Electron Mobility Transistors. In at least some embodiments, each of the switches Q-1, Q-2, and Q-3 comprises a first pair of Gallium-Nitride (GaN) High Electron Mobility Transistors and a second pair of Gallium-Nitride (GaN) High Electron Mobility Transistors connected in series.

The first cycloconverter leg comprises the 4Q switch Q-1 coupled to a capacitor C1, the second cycloconverter leg comprises the 4Q switch Q-2 coupled to a capacitor C2, and the third cycloconverter leg comprises a 4Q switch Q-3 coupled to a capacitor C3. A first AC output phase line is coupled between the switch Q-1 and the capacitor C1, a second AC output phase line is coupled between the switch Q-2 and the capacitor C2, and a third AC output phase line is coupled between the switch Q-3 and the capacitor C3. The converter 102 may also include additional circuitry not shown, such as voltage and/or current monitors, for obtaining data for power conversion, data reporting, and the like.

The converter 102 additionally comprises a controller 106 coupled to the H-bridge switches (S-1, S-2, S-3, and S-4) and the cycloconverter switches (Q-1, Q-2, and Q-3) for operatively controlling the switches to generate the desired output power. In some embodiments, the converter 102 may function as a bi-directional converter.

The controller 106 comprises a CPU 184 coupled to each of support circuits 183 and a memory 186. The CPU 184 may comprise one or more conventionally available microprocessors or microcontrollers. Additionally or alternatively, the CPU 184 may include one or more application specific integrated circuits (ASICs). The support circuits 183 are well known circuits used to promote functionality of the CPU 184. Such circuits include, but are not limited to, a cache, power supplies, clock circuits, buses, input/output (I/O) circuits, and the like. The controller 106 may be implemented using a general purpose computer that, when executing particular software, becomes a specific purpose computer for performing various embodiments of the present disclosure.

The memory 186 is a non-transitory computer readable storage medium such as random access memory, read only memory, removable disk memory, flash memory, and various combinations of these types of memory. The memory 186 is sometimes referred to as main memory and may, in part, be used as cache memory or buffer memory. The memory 186 generally stores the OS 187 (operating system), if necessary, of the controller 106 that can be supported by the CPU capabilities. In some embodiments, the OS 187 may be one of a number of commercially available operating systems such as, but not limited to, LINUX, Real-Time Operating System (RTOS), and the like.

The memory 186 may store various forms application software (e.g., instructions), such as a conversion control module 189 for controlling power conversion by the converter 102, for example maximum power point tracking (MPPT), switching, performing the methods described herein, and the like. The memory 186 may further store a database 199 for storing various data. The controller 106 further processes inputs and outputs to external communications 194 (i.e., gateway) and a grid interface 188.

Figure 2:
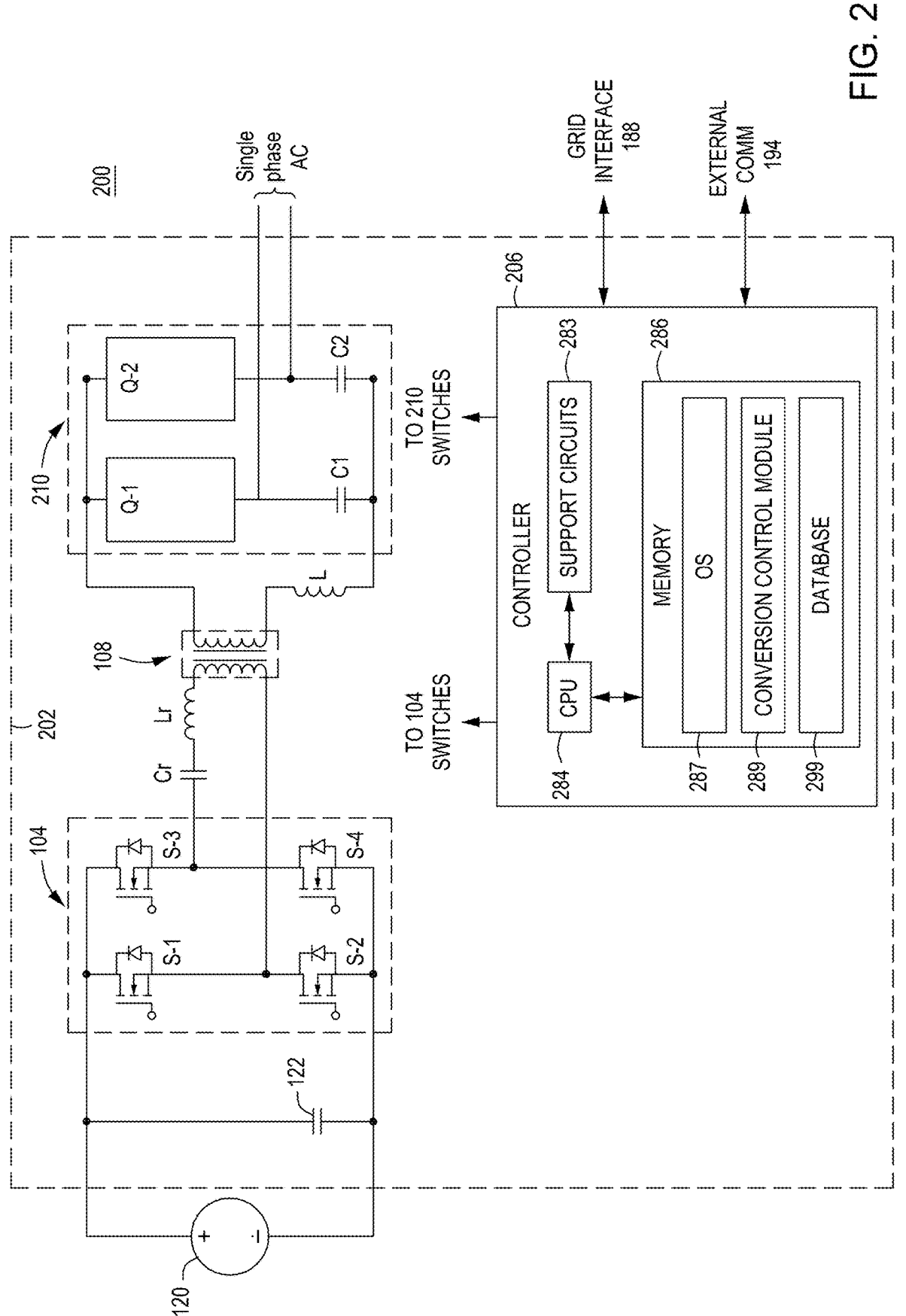
FIG. 2 is a schematic diagram of a power conversion system comprising a switched mode power converter, in accordance with embodiments of the present disclosure.

FIG. 2 is a schematic diagram of a power conversion system 200 comprising a converter 202 (e.g., a switched mode power converter), in accordance with embodiments of the present disclosure.

The power conversion system 200 comprises the DC component 120 coupled to a DC side of the converter 202. The converter 202 comprises the capacitor 122 coupled across the DC component 120 and the H-bridge 104, as described above with respect to the converter 102. The output of the H-bridge 104 is coupled across a series combination of the capacitor Cr and the inductor Lr, which form a resonant tank, and the primary winding of the transformer 108, as described above with respect to the converter 102. In other embodiments, the resonant tank may be formed by a different configuration of the capacitor Cr and the inductor Lr (e.g., the capacitor Cr and the inductor L may be coupled in parallel); in some embodiments, Lr may represent a leakage inductance of the transformer 108 rather than a physical inductor.

A series combination of the secondary winding of the transformer 108 and the inductor L can be coupled across a bridge as described above with respect to FIG. 1. For example, the secondary winding of the transformer 108 and the inductor L can be coupled across a cycloconverter 210 which produces a single-phase AC output. For example, the cycloconverter 210 comprises two bi-directional switches Q-1 and Q-2, (collectively referred to as switches Q) respectively in a first leg and a second leg coupled in parallel to one another. In accordance with embodiments of the present disclosure, each of the switches Q-1 and Q-2 is a native four quadrant bi-directional switch comprising one or more of the aforementioned semiconductor (or vacuum tube) devices. Alternatively or additionally, the cycloconverter 210 can comprise two monolithically formed switches (e.g., a Monolithic Bi-Directional Switch (MBDS))—Gallium-Nitride (GaN) based on a HEMT structure, as described in greater detail below. In at least some embodiments, each of the switches Q-1 and Q-2 comprises a pair of Gallium-Nitride (GaN) High Electron Mobility Transistors. In at least some embodiments, each of the switches Q-1 and Q-2 comprises a first pair of Gallium-Nitride (GaN) High Electron Mobility Transistors and a second pair of Gallium-Nitride (GaN) High Electron Mobility Transistors connected in series.

The first cycloconverter leg comprises the 4Q switch Q-1 coupled to the capacitor C1, and the second cycloconverter leg comprises the 4Q switch Q-2 coupled to the capacitor C2. A first AC output phase line is coupled between the switch Q-1 and the capacitor C1, and a second AC output phase line is coupled between the switch Q-2 and the capacitor C2. The converter 202 may also include additional circuitry not shown, such as voltage and/or current monitors, for obtaining data for power conversion, data reporting, and the like.

The converter 202 additionally comprises a controller 206 coupled to the H-bridge switches (S-1, S-2, S-3, and S-4), and the cycloconverter switches (Q-1 and Q-2) for operatively controlling the switches to generate the desired output power. In some embodiments, the converter 202 may function as a bi-directional converter.

The controller 206 comprises a CPU 284 coupled to each of support circuits 283 and a memory 286. The CPU 284 may comprise one or more conventionally available microprocessors or microcontrollers. Additionally or alternatively, the CPU 284 may include one or more application specific integrated circuits (ASICs). The support circuits 283 are well known circuits used to promote functionality of the CPU 284. Such circuits include, but are not limited to, a cache, power supplies, clock circuits, buses, input/output (I/O) circuits, and the like. The controller 206 may be implemented using a general purpose computer that, when executing particular software, becomes a specific purpose computer for performing various embodiments of the present disclosure.

The memory 286 is a non-transitory computer readable medium such as random access memory, read only memory, removable disk memory, flash memory, and various combinations of these types of memory. The memory 286 is sometimes referred to as main memory and may, in part, be used as cache memory or buffer memory. The memory 286 generally stores the OS 287 (operating system), if necessary, of the controller 206 that can be supported by the CPU capabilities. In some embodiments, the OS 287 may be one of a number of commercially available operating systems such as, but not limited to, LINUX, Real-Time Operating System (RTOS), and the like.

The memory 286 may store various forms of application software, such as a conversion control module 289 for controlling power conversion by the converter 202, for example maximum power point tracking (MPPT), switching, and the like. The memory 286 may further store a database 299 for storing various data. The controller 206 further processes inputs and outputs to external communications 194 (i.e., gateway) and the grid interface 188.

Figure 3:
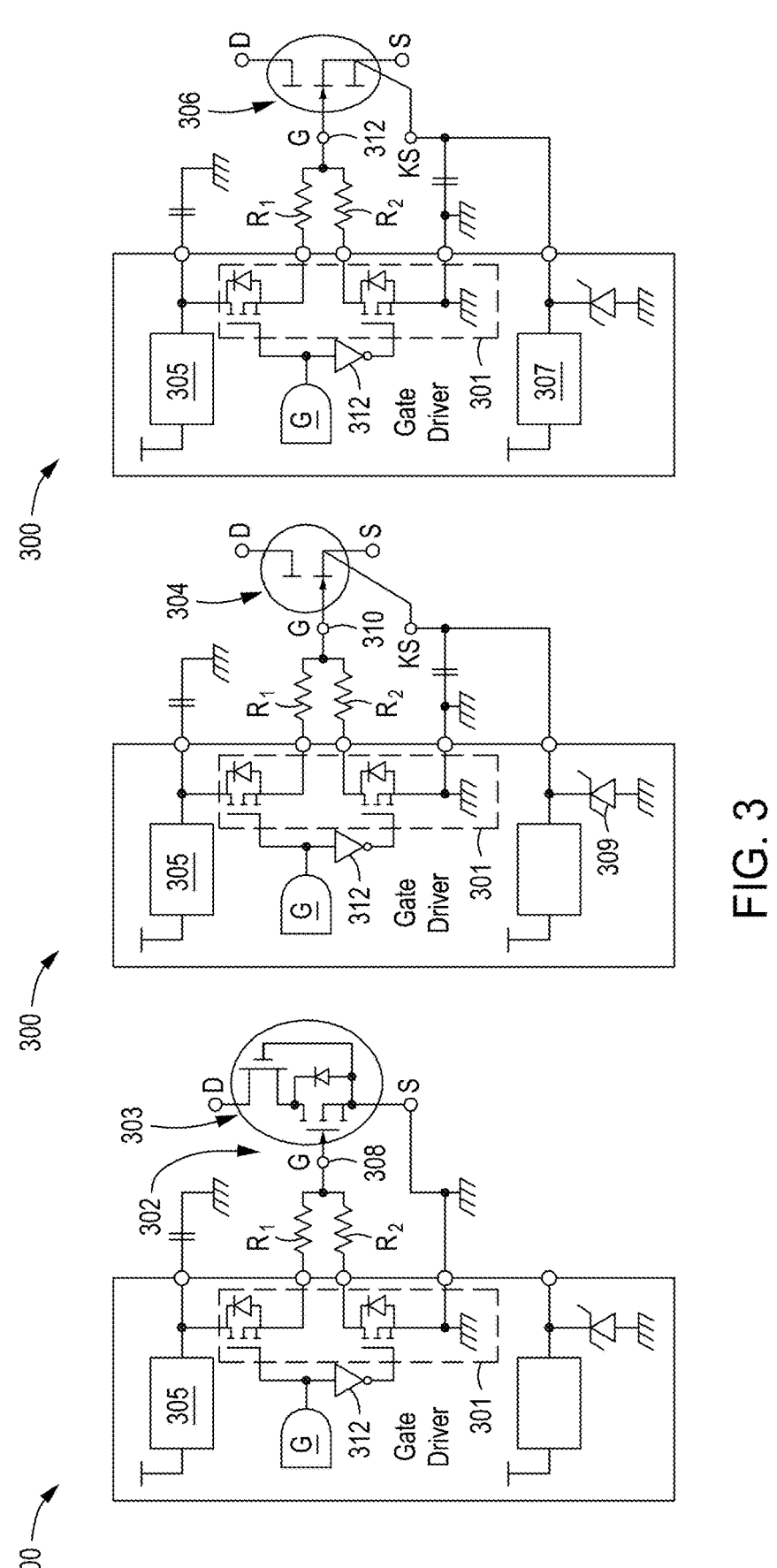
FIG. 3 is a schematic diagram of a universal gate driver, in accordance with embodiments of the present disclosure.

FIG. 3 is a schematic diagram of a universal gate driver 300, in accordance with embodiments of the present disclosure. The universal gate driver 300 is configured for use with one or more GaN HEMT devices (e.g., one or more of the bi-directional switches Q-1, Q-2, or Q-3). Accordingly, the universal gate driver 300 is configured to provide an asymmetrical turn-on and turn-off capabilities. For example, the universal gate driver 300 is configured to provide independent turn-on and turn-off output. For example, a turn-on output pin can pull up to the Gate G drive supply voltage when the Gate G driver is turned on, and, conversely, a turn-off output pin can pull down to the Gate G driver ground when the Gate G driver is turned off. Separate Gate G turn-on and turn-off resistors $R_1$ and $R_2$, respectively, can be used to connect the Gate G driver outputs to the transistor Gate 308, thus, providing an asymmetrical drive while eliminating the use of an external diode and the external diode's associated forward voltage drop.

Continuing with reference to FIG. 3, the universal gate driver 300 is shown configured for use with three different types of GaN HEMT devices. For example, the universal gate driver 300 is shown connected a Cascode GaN HEMT device 302, which is a fusion of a normally on (depletion mode) GaN HEMT connected to a low voltage normally off silicon (Si) MOSFET 303 to provide a required normally off system behavior. Accordingly, driving the Cascode GaN HEMT device 302 closely resembles a drive for a conventional Si MOSFET on the basis that the Cascode GaN HEMT device 302 is actually a Si MOSFET Gate. For example, the transistor Gate 308 input resembles a capacitor and the transistor Gate 308 threshold voltage is, typically, around 4V with the transistor Gate 308 drive voltage of about 9V to about 12V with a maximum the transistor Gate 308 drive voltage of about 16V to about 18V. The Cascode GaN HEMT device 302 does not require a negative transistor Gate 308 turn-off voltage, as a 0V turn-on is adequate to ensure the Cascode GaN HEMT device 302 is turned fully off. Further, the use of a negative transistor Gate 308 turn-off voltage unnecessarily increases the required transistor Gate 308 charge, which is already much higher (approximately 4×) for the Cascode GaN HEMT device 302 compared to a gate injection transistor (GIT) GaN eHEMT and a Schottky Gate GaN eHEMT.

For example, the universal gate driver 300 is configured for use with a GIT GaN HEMT device 304, which features a junction Gate 310 that requires a drive voltage of approximately 1.2V and a sustained typical junction Gate 310 current of about 1 mA to about 10 mA. The junction Gate 310 is driven from the universal gate driver 300 via a resistor (e.g., resistor $R_1$) to limit (set) the required junction Gate 310 drive current—accordingly the GIT GaN HEMT device 304 junction Gate 310 (field effect gate) drive solution does not require a well-regulated junction Gate 310 drive voltage (e.g., similar to the Si MOSFET). Since the junction Gate 310 threshold voltage is so low (e.g., typically, 1.2V, and getting as low as 0.7V at 125° C.), a negative junction Gate 310 turn-off voltage (e.g., via resistor $R_2$) is required to ensure that the GIT GaN HEMT device 304 can be reliably turned off. Due to the junction Gate 310 impact, the negative junction Gate 310 turn-off supply needs to be configured to sink current (e.g., via a Zener diode 309 or another device suitable for sinking current).

Likewise, the universal gate driver 300 is configured for use with a Schottky Gate GaN eHEMT device 306, which features a junction Gate 310 structure that appears to be a capacitor with a junction Gate 310 threshold of about 1 V to about 2V, but requires an applied voltage of about 5V to fully turn the device on, and an absolute maximum junction Gate 310 voltage of about 7V. The junction Gate 310 drive solution for driving the Schottky Gate GaN eHEMT device 306 is well-regulated to achieve a recommended junction Gate 310 drive voltage without endangering the Schottky Gate GaN eHEMT device 306 due to the junction Gate 310 drive over-voltage. As with the GIT GaN HEMT device 304, since the junction Gate 310 threshold voltage for the Schottky Gate GaN eHEMT device 306 is so low (e.g., typically, 1.2V, and getting as low as 0.7V at 125° C.), a negative junction Gate 310 turn-off voltage (e.g., via resistor $R_2$) is required to ensure that the Schottky Gate GaN eHEMT device 306 can be reliably turned off. Unlike the GIT GaN HEMT device 304, however, due to the junction Gate 310 (e.g., capacitive field effect) impact, the negative junction Gate 310 turn-off supply needs to be configured to source current, e.g., via a 1.5 voltage regulator 307 or another device suitable for sourcing current).

The inventor has found that by combining the individual requirements for driving each type of the GaN HEMT devices, a common set of requirements for the universal gate driver 300 can be determined. For example, in at least some embodiments, the universal GaN Gate driver 300 has independent turn-on and turn-off outputs (via the Resistors $R_1$ and $R_2$) for implementing asymmetrical Gate drive characteristics, has voltage regulated supply 305 (e.g., adjustable/programmable) to determine a Gate turn-on voltage, and an optional negative Gate turn-off voltage supply that can both sink (e.g., via the Zener diode 309) and source current (e.g., via the voltage regulator 307). Moreover, the universal Gate driver 300 is also suitable for driving conventional Si MOSFETs (or IGBTs) on the basis that the Cascode GaN HEMT device 302 utilizes a Si MOSFET to drive the Cascode GaN HEMT device 302.

The universal gate driver 300 allows for the use of any of the three types of GaN HEMT devices (e.g., mix and match) in power converters, which mitigates GaN HEMT supply chain issues. For example, as noted above, a single PCB design can be created for a power converter (e.g., microinverter) that employs the universal Gate driver 300 and the single PCB design can be used to employ all three different types of GaN HEMT devices in the power converter, which can provide significant engineering cost saving by not having to support only a single GaN HEMT device. For example, the single PCB design can comprise the universal Gate driver 300 comprising all of the components needed for each of the Cascode GaN HEMT device 302, the GIT GaN HEMT device 304, and Schottky Gate GaN eHEMT device 306.

Figure 4:
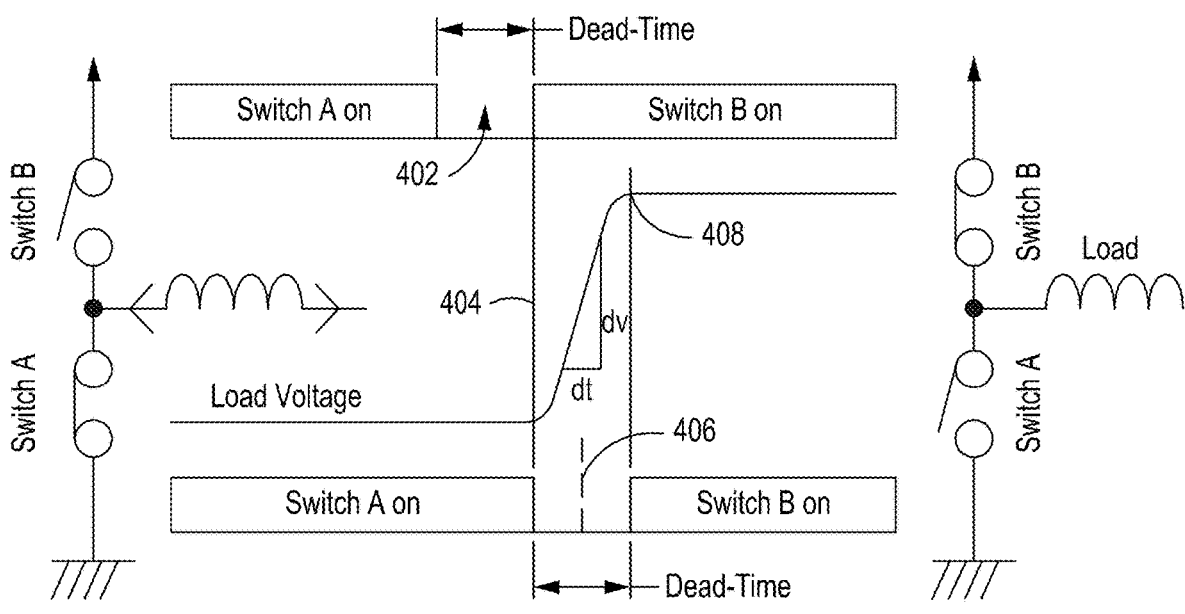
FIG. 4 is a diagram of a hard-switch commutation and a soft-switch commutation, in accordance with embodiments of the present disclosure.

FIG. 4 is a diagram of a hard-switch commutation and a soft-switch commutation, in accordance with embodiments of the present disclosure. For example, with the hysteresis rules in place, the timing information can be defined. For example, $t_{ON}$ is the power transistor on time, $t_{ZVS}$ is the Zero Volt Switching (ZVS) commutation time, $t_{OFF}$ is the power transistor off time, and $t_{tr}$ is the trinary signal transition (rise/fall) time.

Gate drivers only modulate a binary Gate state, e.g., ON or OFF, and a commutation of an inverter leg pair of power transistors requires a specific dead-time during which both an upper transistor and lower transistor are turned off. For example, in hard-switched applications, the dead-time (402) is required to avoid any shoot-through of current. Conversely, for soft-switched applications the dead-time (e.g., ZVS commutation period 404) needs to be controlled to match a naturally occurring ZVS (Zero Volt Switching) commutation time, as described in greater detail below.

Figure 5:
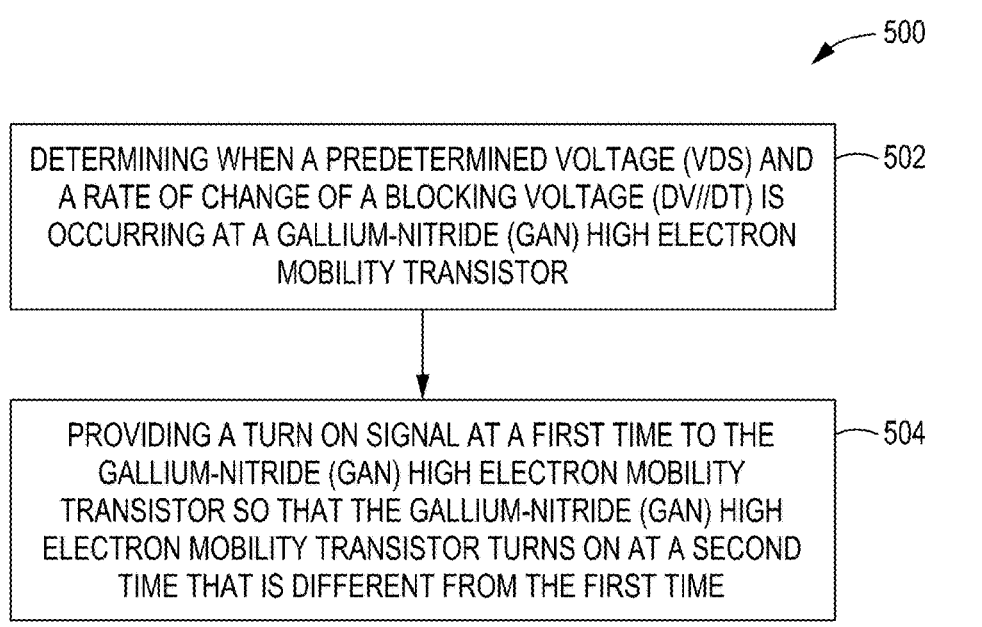
FIG. 5 is a flowchart of a method of controlling a bridge configured for use with a power converter in accordance with embodiments of the present disclosure.

FIG. 5 is a flowchart of a method 500 of controlling a bridge configured for use with a power converter, in accordance with embodiments of the present disclosure. For example, the inventive concepts described herein exploit an inherent characteristic of GaN HEMT devices (e.g., the Cascode GaN HEMT device 302, the GIT GaN HEMT device 304, and Schottky Gate GaN eHEMT device 306). For example, a $C_{iss}$ (the input capacitance)/$C_{rss}$ (the gate-drain capacitance) capacitance ratio is much lower for GaN HEMT transistors than for Si Super-Junction MOSFETs. Accordingly, the capacitance ratio reduces significantly for GaN HEMT for low $V_{ds}$ values (e.g., where Si SJ MOSFETs have a maximum capacitance ratio). The capacitance ratio also provides a measure of how susceptible a transistor Gate drive is to being corrupted during a switching commutation. For example, Si Super-Junction MOSFETs have a $C_{iss}/C_{rss}$ ratio of several thousand, which has been touted as one of their benefits. Such a high ratio means that the Gate drive does not get significantly impacted by any Miller Effects during switching commutations. Conversely, a very low $C_{iss}/C_{rss}$ capacitance ratio in GaN HEMT devices suggests that they are susceptible to the Gate drive being corrupted during a switching commutation. Gate drive corruption (e.g., a transistor assuming an opposite switch state to what is being commanded) due to Miller effects is an undesirable condition for conventional hard-switched converters, e.g., the physical mechanism responsible for slowing down the switching commutation (Miller Plateau—period during a switching commutation that is slowed down due to Miller effects).

The inventor has found, however, that the Miller effect can be used to an advantage in soft-switched converters, as the Miller effect can be harnessed as a mechanism for achieving extremely accurate timing accuracy for the turn-on of a GaN HEMT device at an end of a Zero Volt Switched (ZVS) commutation, but the Miller effect cannot be used in conjunction with conventional Si SJ MOSFETs due to the conventional Si SJ MOSFETs having a very high $C_{iss}/C_{rss}$ ratio.

Accordingly, the methods described herein are configured for use with ZVS (soft-switched) power converter applications, a GaN HEMT device (e.g., with a relatively low attendant $C_{iss}/C_{rss}$ capacitance ratio), a Gate driver circuit that provides separate control of the Gate turn-on and Gate turn-off current via means of separate Gate turn-on and turn-off resistors (e.g., $R_1$ and $R_2$, which as described above are commonly employed in power converter applications). Additionally, the Gate turn-on resistor in the above Gate drive circuit is set to a much higher value than would be typically used (e.g., $R_1$ (or $R_{on}$) is 10× to 100× larger than normally used, the value of which is chosen to maximize a benefit of harnessing the Miller effect to an advantage). Moreover, the ZVS dead time (period during a switching commutation that both FET Gates are in their off states) is adjusted to deliberately turn the Gate of the transistor on mid-way through the ZVS commutation, which conventionally is considered as an inadequately too short dead time.

Continuing with reference to FIG. 5, at 502, the method 500 comprises determining when a predetermined voltage (Vds) and a rate of change of a blocking voltage (dV/dt) is occurring at one of a pair of Gallium-Nitride (GaN) High Electron Mobility Transistors. Next, at Next, at 504, the method 500 comprises providing a turn on signal at a first time to the one of the pair of Gallium-Nitride (GaN) High Electron Mobility Transistors so that the one of the pair of Gallium-Nitride (GaN) High Electron Mobility Transistors turns on at a second time that is different from the first time.

For example, one or more of the GaN HEMT devices described with reference to FIG. 3 can be connected in series with each other. In at least some embodiments, two Cascode GaN HEMT devices 302 can be connected in series with other. In other embodiments, as noted above, since the gate drivers described herein can be configured to connect to any of the GaN HEMT devices described with reference to FIG. 3, two different types of the GaN HEMT can be connected to each other in series (e.g., the Cascode GaN HEMT device 302 can be connected in series with the GIT GaN HEMT device 304 or the Schottky Gate GaN eHEMT device 306).

The GaN HEMT device that is configured to turn on at the end of the ZVS commutation time (e.g., switch B at the end of 404, the second time) has a Gate driver (e.g., the universal Gate driver 300) turn on approximately mid-way through the ZVS commutation period 404 (e.g., due to the deliberately too short dead time, see mid-way point 406 in FIG. 4, the first time). In at least some embodiments, at 502, under control of a controller (e.g., the controller 106 or the controller 206), the Gate driver turns on at a time when there is an appreciable voltage ($V_{ds}$) across the GaN HEMT device and a considerable rate of change of the blocking voltage (dV/dt) occurring. For example, in at least some embodiments, the $V_{ds}$ blocking voltage (as would be the case for an AC mains powered off-line PSU application) can be about 400V. Other blocking voltages, however, can also be used depending on a particular GaN HEMT application. In at least some embodiments, commutation dV/dt rates can be about 5V/ns to 50V/ns, also depending on a particular GaN HEMT application. The considerable dV/dt causes a significant displacement current to flow through the Miller capacitance (Cdg, Gate-to-Drain Capacitance) of the GaN HEMT device. The combination of the displacement current with the low Gate-to-Source capacitance (Cgs) and high value of the Gate turn-on resistor ($R_1$ or $R_{on}$) results in the Gate driver not being able to effectively overpower the displacement current, hence the GaN HEMT device does not actually turn on at approximately the mid-way through the ZVS commutation period 404. Thus, the GaN HEMT device remains turned off despite the Gate driver being turned on due to the Miller displacement current overpowering the relatively weak Gate drive turn-on current (e.g., due to the high Gate turn-on resistor).

At 504, the GaN HEMT device (e.g., at the second time that is different from the first time) is actually turned on. For example, at the end of the ZVS commutation period 404 (e.g., when the dV/dt (& Vds) reduces towards zero, see 408 in FIG. 4) the Miller displacement current also reduces towards zero allowing the Gate driver to eventually overpower the displacement current and finally turn the GaN HEMT device on. Accordingly, the GaN HEMT device turns on exactly at the right time at the end of the ZVS commutation period 404, despite the relatively inaccurate turn-on of the Gate driver somewhere in the vicinity of the mid-way point 406 during the ZVS commutation period 404.

While the foregoing is directed to embodiments of the present disclosure, other and further embodiments of the disclosure may be devised without departing from the basic scope thereof, and the scope thereof is defined by the claims that follow.

The invention claimed is:

1. A bridge configured for use with a power converter, comprising:
   a switch comprising a Gallium-Nitride (GaN) High Electron Mobility Transistor; and
   a Gate driver coupled to a gate of the Gallium-Nitride (GaN) High Electron Mobility Transistor and configured to provide a turn on signal to the Gallium-Nitride (GaN) High Electron Mobility Transistor at a first time when the Gallium-Nitride (GaN) High Electron Mobility Transistor is off so that the Gallium-Nitride (GaN) High Electron Mobility Transistor turns on at a second time that is different from the first time,
   wherein the first time is at approximately a mid-way point of a Zero Volt Switching (ZVS) commutation time that is when a rate of change of a blocking voltage (dV/dt) and a predetermined voltage (Vds) are reduced towards zero, and
   wherein the second time is at an end of the Zero Volt Switching (ZVS) commutation time.

2. The bridge of claim 1, wherein the Gallium-Nitride (GaN) High Electron Mobility Transistor is one of a Cascode GaN HEMT device, a gate injection transistor (GIT) GaN eHEMT device, or a Schottky Gate GaN eHEMT device.

3. The bridge of claim 1, wherein at the mid-way point of the Zero Volt Switching (ZVS) commutation time, the predetermined voltage (Vds) is about 400V across the Gallium-Nitride (GaN) High Electron Mobility Transistor and the rate of change of the blocking voltage (dV/dt) is about 5V/ns to about 50V/ns.

4. The bridge of claim 1, wherein the switch is one of a Uni-Directional switch, a Bi-Directional switch, or a Monolithic Bi-Directional Switch (MBDS).

5. The bridge of claim 1, wherein the switch comprises a pair of Gallium-Nitride (GaN) High Electron Mobility Transistors connected in series.

6. A power conversion system, comprising:

a converter;

a DC component coupled to a DC side of the converter;

a plurality of switches coupled to a primary winding of a transformer; and a bridge coupled to a secondary winding of the transformer and comprising:

a switch comprising a Gallium-Nitride (GaN) High Electron Mobility Transistor; and a Gate driver coupled to a gate of the Gallium-Nitride (GaN) High Electron Mobility Transistor and configured to provide a turn on signal to the Gallium-Nitride (GaN) High Electron Mobility Transistor at a first time when the Gallium-Nitride (GaN) High Electron Mobility Transistor is off so that the Gallium-Nitride (GaN) High Electron Mobility Transistor turns on at a second time that is different from the first time, wherein the first time is at approximately a mid-way point of a Zero Volt Switching (ZVS) commutation time that is when a rate of change of a blocking voltage (dV/dt) and a predetermined voltage (Vds) are reduced towards zero, and wherein the second time is at an end of the Zero Volt Switching (ZVS) commutation time.

7. The power conversion system of claim 6, wherein the Gallium-Nitride (GaN) High Electron Mobility Transistor is one of a Cascode GaN HEMT device, a gate injection transistor (GIT) GaN eHEMT device, or a Schottky Gate GaN eHEMT device.

8. The power conversion system of claim 6, wherein at the mid-way point of the Zero Volt Switching (ZVS) commutation time, the predetermined voltage (Vds) is about 400V across the Gallium-Nitride (GaN) High Electron Mobility Transistor and the rate of change of the blocking voltage (dV/dt) is about 5V/ns to about 50V/ns.

9. The power conversion system of claim 6, wherein the switch is one of a Uni-Directional switch, a Bi-Directional switch, or a Monolithic Bi-Directional Switch (MBDS).

10. The power conversion system of claim 6, wherein the switch comprises a pair of Gallium-Nitride (GaN) High Electron Mobility Transistors connected in series.

11. A method of controlling a bridge configured for use with a power converter, comprising:

determining when a predetermined voltage (Vds) and a rate of change of a blocking voltage (dV/dt) is occurring at a Gallium-Nitride (GaN) High Electron Mobility Transistor; and providing a turn on signal at a first time to the Gallium-Nitride (GaN) High Electron Mobility Transistor when the Gallium-Nitride (GaN) High Electron Mobility Transistor is off so that the Gallium-Nitride (GaN) High Electron Mobility Transistor turns on at a second time that is different from the first time, wherein the first time is at approximately a mid-way point of a Zero Volt Switching (ZVS) commutation time that is when the rate of change of the blocking voltage (dV/dt) and the predetermined voltage (Vds) are reduced towards zero, and wherein the second time is at an end of the Zero Volt Switching (ZVS) commutation time.

12. The method of claim 11, wherein the Gallium-Nitride (GaN) High Electron Mobility Transistor is one of a Cascode GaN HEMT device, a gate injection transistor (GIT) GaN eHEMT device, or a Schottky Gate GaN eHEMT device.

13. The method of claim 11, wherein at the mid-way point of the Zero Volt Switching (ZVS) commutation time, the predetermined voltage (Vds) is about 400V across the Gallium-Nitride (GaN) High Electron Mobility Transistor and the rate of change of the blocking voltage (dV/dt) is about 5V/ns to about 50V/ns.

14. The method of claim 11, wherein the Gallium-Nitride (GaN) High Electron Mobility Transistor is a component of a switch that is one of a Uni-Directional switch, a Bi-Directional switch, or a Monolithic Bi-Directional Switch (MBDS).

15. The method of claim 11, wherein the Gallium-Nitride (GaN) High Electron Mobility Transistor is a component of a switch that comprises a pair of Gallium-Nitride (GaN) High Electron Mobility Transistors connected in series.

\* \* \* \* \*